United States Patent [19]

Miwa et al.

[11] Patent Number: 4,483,434
[45] Date of Patent: Nov. 20, 1984

[54] APPARATUS FOR CONVEYING SEMICONDUCTOR SUBSTRATES

[75] Inventors: Kenji Miwa, Kawasaki; Noriyoshi Hashimoto, Yokohama, both of Japan

[73] Assignee: Nippon Kogaku K. K., Japan

[21] Appl. No.: 374,773

[22] Filed: May 4, 1982

[30] Foreign Application Priority Data

May 12, 1981 [JP] Japan ................................ 56-71171

[51] Int. Cl.³ ............................................. B65G 47/24
[52] U.S. Cl. .................................................. 198/394
[58] Field of Search ....................... 198/394, 379, 344; 406/87; 414/757

[56] References Cited

U.S. PATENT DOCUMENTS

| | | | |
|---|---|---|---|
| 2,426,433 | 5/1945 | Carter | 198/379 |
| 3,297,134 | 2/1966 | Pastuszak | 198/394 |
| 3,554,352 | 1/1971 | Hillman | 198/394 |
| 4,376,482 | 3/1983 | Wheeler et al. | 198/394 |

OTHER PUBLICATIONS

IBM Technical Disclosure Bull., (Wafer Notch Orienter), Jukich, Miller & Spira, vol. 14, No. 8, Jan. 1972.

*Primary Examiner*—Joseph E. Valenza
*Assistant Examiner*—Kyle E. Shane
*Attorney, Agent, or Firm*—Shapiro and Shapiro

[57] ABSTRACT

An alignment apparatus for positioning a substrate in a determined position comprises three rotating rollers having outer circumferences contactable with the circumference of the substrate at three different portions thereof. A first roller and at least one of the remaining rollers are driven to rotate the substrate in a predetermined direction. A holder holds the first roller and is displaceably biased toward the remaining rollers. A rotation inhibitor comes into close contact with a flat on the substrate when the substrate comes to a predetermined rotated position in which the flat and the first roller are in opposition to each other. The rotation inhibitor is provided integrally with the holder in such a predetermined positional relation to the first roller that as a result of the close contact with the flat of the substrate, the inhibitor can inhibit the holder from being moved in the direction for contact between the first roller and the flat.

3 Claims, 7 Drawing Figures

APPARATUS FOR CONVEYING SEMICONDUCTOR SUBSTRATES

BACKGROUND OF THE INVENTION

The present invention relates to an automatic conveyor apparatus for conveying semiconductor substrates and positioning the substrates correctly in a predetermined position. More particularly, the present invention relates to a pre-alignment apparatus for use in a conveyor system for conveying a substrate having a pattern such as an integrated circuit formed thereon to a pattern examination station in which the substrate is to be placed in a predetermined position relative to an optical apparatus by which the pattern is examined.

At the last step of the known manufacturing process of integrated circuits such as LSI or VLSI, the very fine pattern of the integrated circuit formed on a substrate such as a semiconductor wafer is examined by use of an optical apparatus such as a microscope. In order to increase the efficiency of pattern examination there has been used an automatic conveyor system which is able to correctly place the semiconductor substrate on the stage of an optical apparatus in a determined position and in a determined orientation. Such automatic conveyor system conventionally used for this purpose is generally provided with rotating rollers in contact with the outer circumference of the substrate and a photoelectric detector. At the prealignment step, the substrate is held by the rotating rollers and also rotated by the rollers in the circumferential direction. During the time the substrate is rotated, the photo-electric detector watches the peripheral shape of the substrate to set the position and orientation of the substrate as required.

In pre-alignment of the substrate by the known apparatus no problem occurs so long as all of the substrates to be examined have the same shape and the same size according to the same standard. However, if the substrates have different sizes and shapes according to different standards, then a precise adjustment of the position of the photo-electric detector is required. Otherwise, any pre-alignment with high accuracy is no longer possible. This adjustment of the position of the detector has to be made every time the size of the substrate to be conveyed is changed. Obviously, this is time consuming and reduces the efficiency of the examination work.

SUMMARY OF THE INVENTION

Accordingly, it is an object of the invention to provide an improved conveying apparatus for substrates such as semiconductor wafers which enables the precise pre-alignment of the substrates.

It is another object of the invention to provide a pre-alignment apparatus for substrate conveyor apparatus which is able to accommodate itself to all of substrates having different sizes and shapes in a very simple manner.

Other and further objects, features and advantages of the invention will appear more fully from the following description taken in connection with the accompanying drawings.

DESCRIPTION OF PREFERRED EMBODIMENTS

Figure 1:
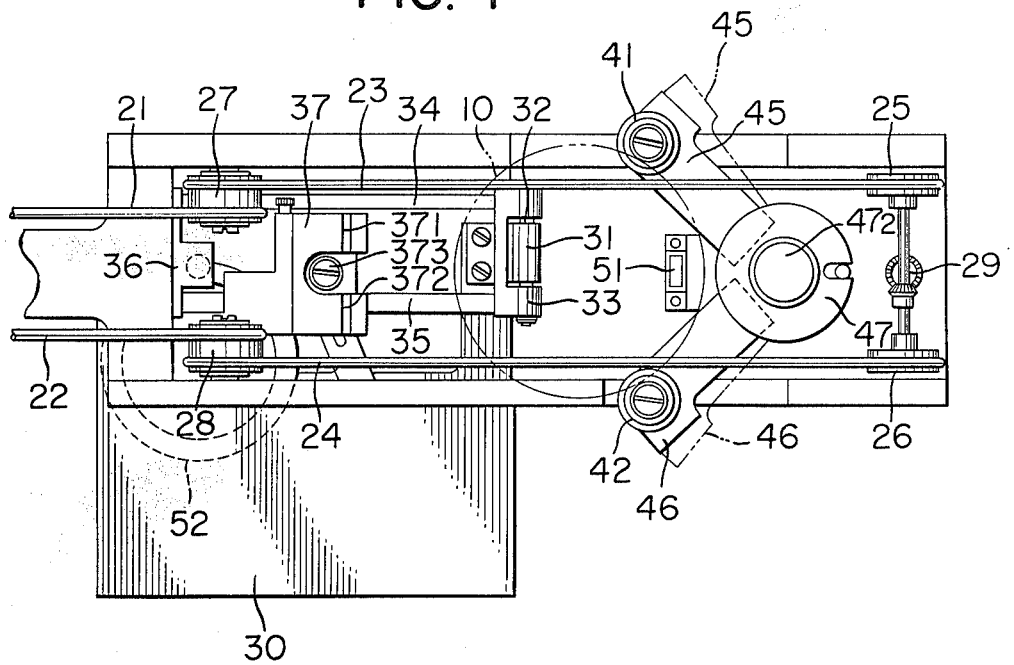
FIG. 1 is a plan view of an embodiment of the invention.
Figure 2:
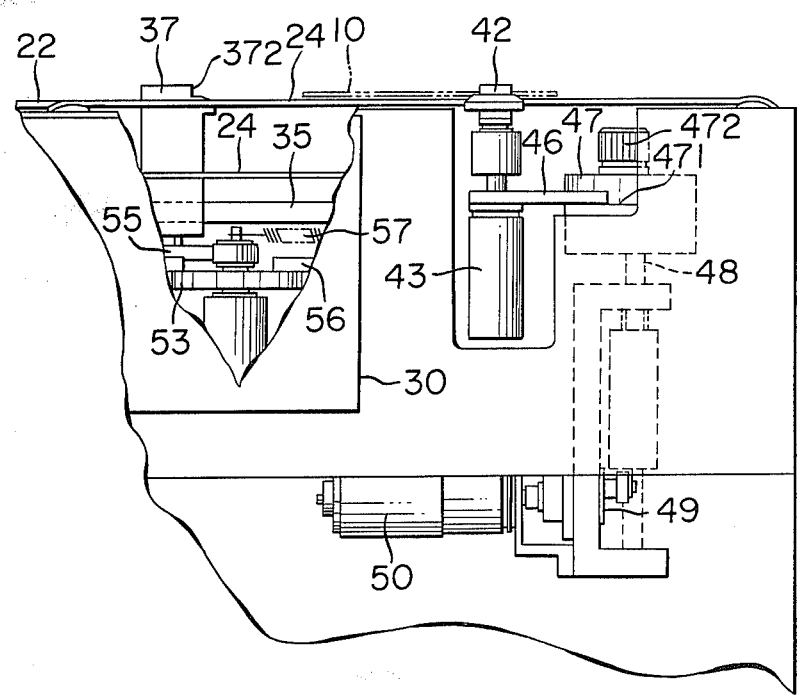
FIG. 2 is a side view thereof.

An embodiment of the present invention is disclosed in FIGS. 1 and 2.

Although not shown in the drawing, on the lefthand side of the apparatus there is a cassette containing semiconductor wafers. Each semiconductor wafer is transported to the working area shown in FIGS. 1 and 2 from the cassette by conveyor belts 21, 22, 23, 24 moving around belt pulleys 25, 26, 27, 28 driven by a driving unit 29 comprising a motor. A bearing 31 is fixed to a housing 30 to support the shaft 32 of a mount 33 for rotation. The mount 33 has a guide 34 and a sub-guide 35 mounted thereon. The fore ends of the guides 34 and 35 are supported together on a support plate 36. A positioning member 37 is slidably movable along the guides 34 and 35. The positioning member 37 has two reference surfaces 371 and 372, and a rotating roller 373. The reference surfaces 371 and 372 are opposed to the rotating shaft 32 and disposed substantially normal to the direction of the slide movement of the positioning member. The rotating roller 373 is disposed between the two reference surfaces 371 and 372 with the outer circumferential surface of the roller being slightly retracted from the reference surfaces. The roller 373 is rotatably driven by a driving source not shown.

On the right-hand side of the housing 30 there are a pair of rollers 41 and 42 mounted on the fore-end parts of two levers 45 and 46 respectively. At least one and preferably both of the rollers 41 and 42 are rotatably driven by a driving source such as a motor 43. The levers 45 and 46 are fixed on a bearing surface 471 for an exchangeable unit 47 with a predetermined opening angle between the two levers. The exchangeable unit 47 is firmly mounted on a shaft 48 which is vertically slidable under the action of an eccentric cam 49 driven by a motor 50. The exchangeable unit is held in the position by a lock nut 472. After removing the lock nut, the unit 47 can be removed from the bearing surface 471. The exchangeable unit 47 has two radial slots formed on the underside surface of the unit to hold the levers 45 and 46 with the predetermined opening angle between the two levers. To this end, the opening angle which the two slots form corresponds to the opening angle at which the two levers 45 and 46 should be fixed. The levers are fitted in the radial slots respectively. To accommodate the lever opening angle to wafers having different diameters, several kinds of such exchangeable units are prepared which are different from each other in the opening angle between the two slots formed on the underside surface. Therefore, the center of the wafer can be positioned always at a predetermined constant position by suitably selecting one of the prepared exchangeable units according to the diameter of the wafer. For example, in the case of a wafer having a larger diameter than the wafer 10 shown in FIG. 1, the levers 45 and 46 can be set to a larger opening angle as shown in phantom.

Designated by 51 is a wafer detection switch having a light emitting part and a light receiving part. When a wafer is conveyed toward the levers 45 and 46 and comes into contact with the rollers 41 and 42, the detection switch 51 detects the wafer by means of the reflected light from the underside surface of the wafer.

Figure 3:
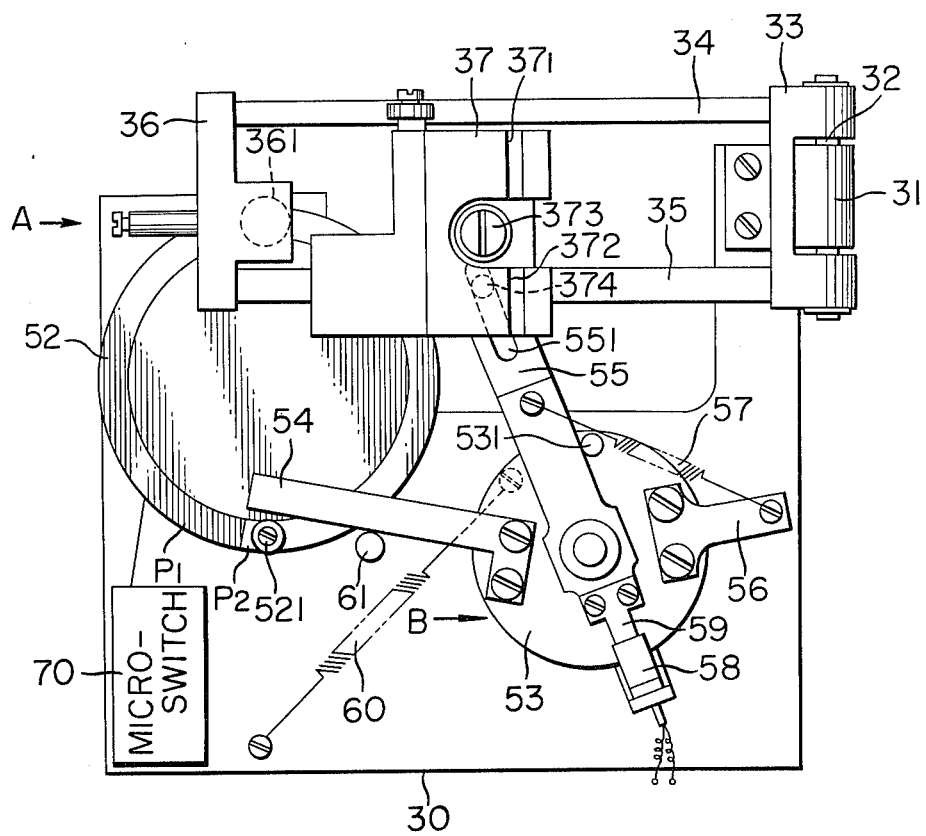
FIG. 3 is a plan view of the essential part of the apparatus shown in FIG. 1 showing also the internal part of the apparatus.

The operation of the positioning member 37 is controlled by a control mechanism as shown in FIG. 3.

Figure 4:
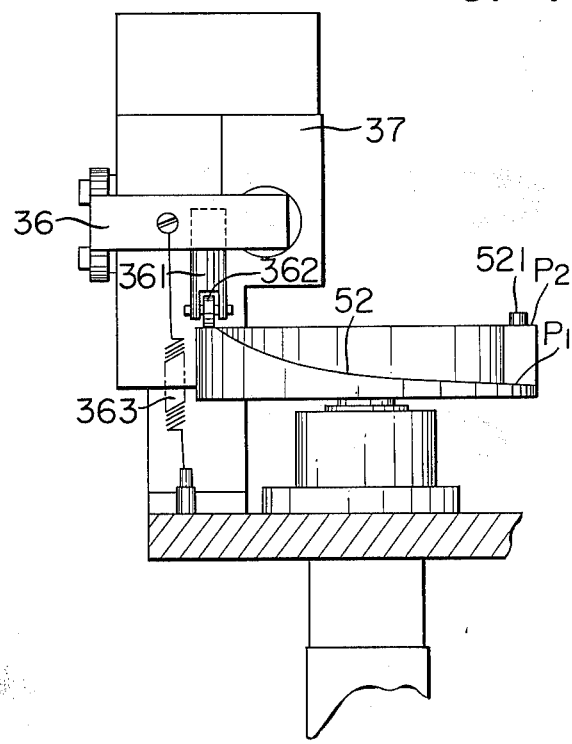
FIG. 4 is a view looking in the direction of arrow A in FIG. 3.

The guide supporting plate 36 has a projection 361 downwardly projecting from the underside surface of the plate as shown in FIG. 4. At the free end of the projection 361 there is provided a roller 362. Under the biasing force of a spring 363 acting on the guide supporting plate 36, the roller 362 is kept in contact with a circumferential cam 52. $P_1$ indicates the lowest point of the cam. Starting from the lowest point $P_1$ and looking in the direction of clockwise rotation, the height of the cam surface gradually increases up over the distance of about a half of the circumference. Over another half of the circumference, the cam remains constant in height. $P_2$ indicates the end point of the constant level cam area. Therefore, a step is formed between the two points $P_1$ and $P_2$. At the portion of $P_2$ there is provided a pin 521.

When the roller 362 is in contact with the lowest point $P_1$ of the cam, the positioning member 37 is in its lowest position and the reference surfaces 371, 372 and the roller 362 are under and spaced from the belts 23, 24 shown in FIG. 1. Therefore, in this position, the wafer is allowed to be conveyed by the belts 23, 24 passing over the positioning member 37. The circumferential cam 52 is started in counter-clockwise rotation by a wafer detection signal from the detection switch 51. During the first half rotation of the cam 52 up to the position shown in FIG. 3, the positioning member 37, guides 34, 35 and support plate 36 are turned up about the shaft 32 and brought to the position shown in FIG. 2.

Figure 5:
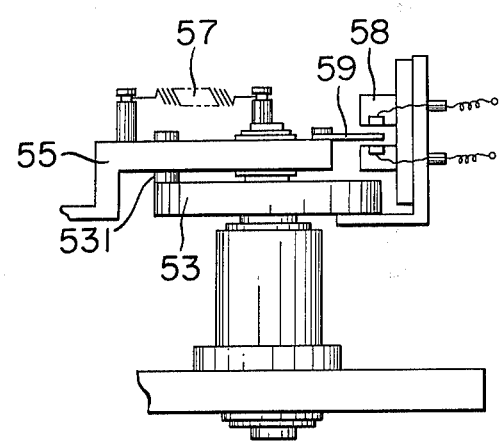
FIG. 5 is a partial side view looking in the direction of arrow B in FIG. 3.

A further counter-clockwise rotation of the cam 52 from the position shown in FIG. 3 pushes a lever 54 by the above mentioned pin 521 provided at $P_2$ of the cam. The lever 54 is fixed to a rotary member 53 and the pin 521 pushes the lever to rotate it clockwise. The rotary member 53 has also a driving bar 55 rotatable coaxially with the rotary member. The driving bar has an elongate slot 551 in which a pin 374 is engaged. The pin 374 is projected from the underside of the positioning member 37. Through the pin-slot engagement, the driving bar can drive the positioning member 37 along the guides 34, 35. One end of a spring 57 is anchored on the driving bar and another end of the spring is fastened to a fixing member 56 on the rotary member 53. The spring 57 biases the bar 55 to clockwise rotation. As seen best in FIG. 5, a photo sensor 58 is fixedly mounted on the rotary member 53. A screen plate 59 for the photo sensor 58 is fixed to the driving bar 55. On the rotary member 53 there is provided also a stop 531 to limit the rotation of the driving bar 55. As shown in FIG. 3, the apparatus includes a microswitch 70 which is closed when the point $P_1$ of the cam 52 and the projection 361 are opposed to each other at the starting position of the system.

Figure 6:
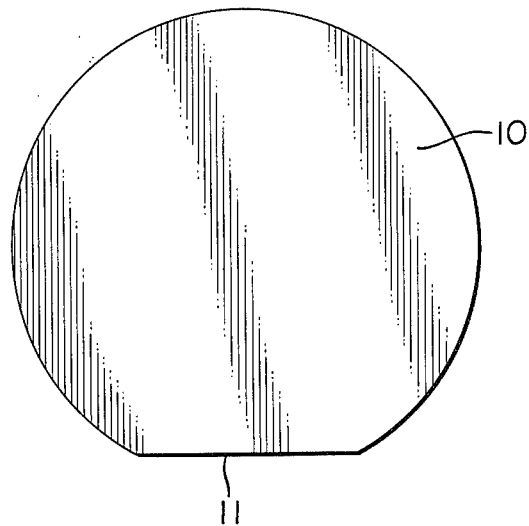
FIG. 6 is a plan view showing an example of a semiconductor wafer.

FIG. 6 shows the general shape of a wafer 10 to be conveyed by the apparatus according to the above embodiment. The wafer 10 is generally in the shape of a disk a portion of which is cut out to provide a straight line end surface 11. This end surface 11 is called an orientation flat in the art.

In the starting position for operation, the projection 361 of the support plate 36 is in contact with the cam 52 at the lowest point $P_1$. Therefore, the reference surfaces 371, 372 and roller 373 of the positioning member 37 are all in the lowered position in which they do not interfere with the conveyance of a wafer by the belts 23, 24. With the start of conveyance of the wafer 10, the shaft 48 is lifted up to the uppermost position as shown in FIG. 2. In this position, the rollers 41 and 42 are above the belts 23, 24 so that the wafer on the conveyor belts can come into contact with rollers 41 and 42. When the entrance of the wafer 10 into the positioning area is detected by the wafer detection switch 51, the circumferential cam 52 starts rotating counter-clockwise. During the first half rotation of the cam, the positioning member 37 moves up and the reference surfaces 371, 372 and roller 373 come up above the level of the belts 23, 24. During the second half rotation of the cam 52, the rotary member 53 rotates clockwise while storing the biasing force in the spring 60. As the spring fixing member 56 rotates with the rotation of the rotary member 53, the driving bar 55 is pulled by the spring 57 and rotates clockwise. Consequently, the positioning member 37 is moved rightwards along the guides 34, 35 by the driving bar. When the reference surfaces 371, 372 or the rotating roller 373 contact the wafer, no further rotation of the driving bar is allowed. Therefore, the rotary member 53 continues rotating with the expansion of the spring 57. By this relative displacement between the rotary member 53 and the driving bar 55, the screen plate 59 fixed to the driving bar 55 is separated from the area between two elements of the sensor 58. At this time, the sensor produces a signal to stop the rotation of the cam 53. A constant biasing force is applied to the positioning member 37. The biasing force intends to move the member 37 rightwards as viewed on the drawing. Therefore, the wafer is firmly held between three rollers and two reference surfaces by the biasing force which is always constant irrespective of the outer diameter of wafer.

Figure 7:
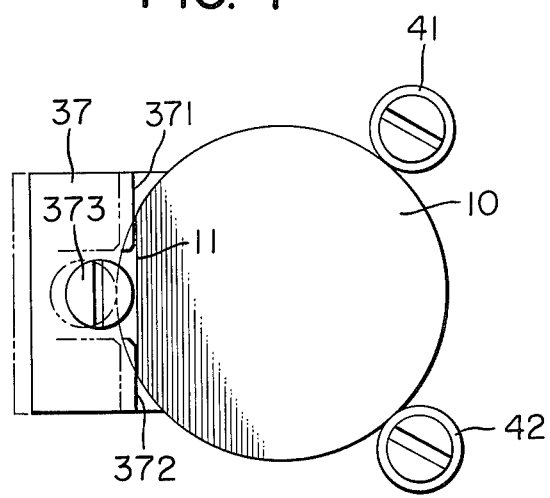
FIG. 7 is a plan view showing how to hold the wafer.

In response to the stop signal from the sensor 58, the respective driving sources for rollers 373, 41 and 42 are brought into operation. Thus, the three rollers start to rotate in the same direction and at substantially the same peripheral speed. The three rollers 373, 41 and 42 are rotated for a predetermined time which is nearly equal to the time for one rotation of the wafer. As the wafer rotates, its end surface 11 comes to a position in opposition to the reference surfaces 371, 372. In this position, the positioning member 37 is shifted from the position shown by the phantom line to the position indicated by the solid line in FIG. 7. The reference surfaces 371 and 372 are in close contact with the end surface 11 of the wafer 10. Since, as previously noted, the rotating roller 373 is slightly retracted from the reference surfaces 371, 372, the roller 373 can not contact with wafer 10 in this position. The torque of the rollers 41 and 42 is so predetermined as not to give the wafer 10 a turning force sufficient to move the positioning member 37 leftwards against the biasing force of the spring 57 tending to move the positioning member rightwards. Therefore, the wafer 10 is inhibited from rotating further from the position shown in FIG. 7 and remain in that position. In this manner, alignment of the wafer can always be performed in the same definite position with respect to the center of the wafer and the orientation of the end surface 11.

The wafer in the above aligned position can be transferred onto a suitable transfer member such as a turning lever after the wafer is moved from the aligned position by vacuum suction means not shown. The lever turns through a predetermined rotation angle to place the wafer on the stage of a microscope. Since every wafer can be placed on the stage in the same position and in the same orientation, the microscopic examination on the same pattern on every wafer can be carried out at a high speed.

In the above embodiment, the reference plane has been composed of two surfaces 371 and 372 located on both sides of the rotating roller 373. However, it is to be noted that the present invention is not limited to the embodiment shown. For example, if the wafer is rotated counter-clockwise by rollers, then the reference surface 372 may be omitted. It is not always necessary to form the reference surfaces 371, 372 as flat surfaces. A reference plane may be formed of projection-like portions although the flat reference surface shown in the above embodiment is preferable in view of higher accuracy of alignment.

We claim:

1. An alignment apparatus for positioning a substrate in a predetermined position, said substrate being in the shape of a plate having a generally circular periphery with a peripheral flat, said alignment apparatus comprising:
   a. first, second and third roller means all of which are rotatable and have outer circumferences positioned to contact the periphery of said substrate at three different portions thereof;
   b. driving means for rotating said first roller means and at least one of said second and third roller means and for thereby rotating said substrate in a predetermined direction; and
   c. holding means for holding said first roller means, said holding means being displaceably biased toward said second and third roller means and having, integral therewith, means for inhibiting rotation of said substrate, said rotation inhibiting means comprising contact surface means adjacent to said first roller means, and extending toward substrate beyond said first roller means, for contacting said peripheral flat when said substrate has a predetermined rotational position and for maintaining the rotational position of said substrate while keeping said first roller means from rotational engagement with said substrate.

2. An alignment apparatus as set forth in claim 1, wherein said contact surface means includes a pair of contact surfaces disposed at opposite sides of said first roller means, respectively, and extending toward said substrate beyond said first roller means, said contact surfaces being separated by a distance less than the length of said flat and being positioned relative to said first roller means so as to be disengaged from the periphery of said substrate except when said flat is engaged with said contact surfaces.

3. An alignment apparatus as set forth in claim 2, wherein said contact surfaces comprise coplanar flat surfaces positioned to be juxtaposed with said flat when said substrate has said predetermined rotational position.

* * * * *